US009401686B2

(12) United States Patent
Bell

(10) Patent No.: US 9,401,686 B2
(45) Date of Patent: Jul. 26, 2016

(54) VOLUME CONTROL ASSEMBLY

(71) Applicant: Paul Bell, Milwaukie, OR (US)

(72) Inventor: Paul Bell, Milwaukie, OR (US)

( * ) Notice: Subject to any disclaimer, the term of this patent is extended or adjusted under 35 U.S.C. 154(b) by 181 days.

(21) Appl. No.: 14/335,356

(22) Filed: Jul. 18, 2014

(65) Prior Publication Data

US 2016/0020741 A1   Jan. 21, 2016

(51) Int. Cl.
  *H03G 3/02*   (2006.01)
  *H03G 3/04*   (2006.01)
  *H03G 3/30*   (2006.01)

(52) U.S. Cl.
  CPC .......... *H03G 3/3005* (2013.01); *H04R 2430/01* (2013.01)

(58) Field of Classification Search
  CPC ......... H03G 3/3005; H03G 3/02; H03G 3/04; H04R 2430/01
  USPC .......................................... 381/104, 106, 109
  See application file for complete search history.

(56) References Cited

U.S. PATENT DOCUMENTS

| 2,481,045 | A |   | 9/1949 | Schroeder | |
|---|---|---|---|---|---|
| 5,464,830 | A |   | 11/1995 | Hallinan et al. | |
| 6,011,852 | A | * | 1/2000 | Howard | H04R 5/00 381/101 |
| 7,278,101 | B1 | * | 10/2007 | Cassezza | G06F 3/04847 381/104 |
| 7,390,957 | B2 | * | 6/2008 | Iwata | H03G 3/02 381/109 |
| 7,390,960 | B1 | * | 6/2008 | Arnold | G10H 3/187 330/302 |
| 7,826,627 | B2 | * | 11/2010 | Radek | G07F 17/32 381/104 |
| D654,449 | S |   | 2/2012 | Chastain | |
| 8,130,980 | B2 |   | 3/2012 | Wong et al. | |
| 8,284,960 | B2 | * | 10/2012 | Vaudrey | H03G 7/002 381/106 |
| 2007/0076131 | A1 |   | 4/2007 | Li et al. | |
| 2007/0086604 | A1 | * | 4/2007 | Guillorit | H03G 3/3005 381/107 |
| 2009/0262955 | A1 |   | 10/2009 | Kimura | |
| 2013/0156226 | A1 |   | 6/2013 | Huang et al. | |

FOREIGN PATENT DOCUMENTS

CN           1909625       2/2007

* cited by examiner

Primary Examiner — David Ton

(57) ABSTRACT

A volume control assembly includes a housing that may be positioned proximate an external electronic device. A processor is coupled to the housing. A loud actuator is coupled to the housing and the processor. The loud actuator determines a maximum volume of an audio signal. A quiet actuator is coupled to the housing and the processor. The quiet actuator determines a minimum volume of the audio signal. An amplifier is coupled to the housing and the processor. The amplifier amplifies the audio signal above the minimum volume and below the maximum volume. An input is coupled to the housing, the processor and the external electronic device. The input receives the audio signal from the external electronic device. An output is coupled to the housing, the processor and the external electronic device. The audio signal is directed to the external electronic device between the minimum and maximum volume.

14 Claims, 4 Drawing Sheets

US 9,401,686 B2

VOLUME CONTROL ASSEMBLY

BACKGROUND OF THE DISCLOSURE

Field of the Disclosure

The disclosure relates to control devices and more particularly pertains to a new control device for automatically adjusting an audible volume of an external electronic device between a minimum and a maximum volume.

SUMMARY OF THE DISCLOSURE

An embodiment of the disclosure meets the needs presented above by generally comprising a housing that may be positioned proximate an external electronic device. A processor is coupled to the housing. A loud actuator is coupled to the housing. The loud actuator is operationally coupled to the processor. The loud actuator determines a maximum volume of an audio signal. A quiet actuator is coupled to the housing. The quiet actuator is operationally coupled to the processor. The quiet actuator determines a minimum volume of the audio signal. An amplifier is coupled to the housing. The amplifier is operationally coupled to the processor. The amplifier amplifies the audio signal above the minimum volume determined by the quiet actuator and reduces the audio signal below the maximum volume determined by the loud actuator. An input is coupled to the housing. The input is operationally coupled to the processor. The input is operationally coupled to the external electronic device. The input receives the audio signal from the external electronic device. An output is coupled to the housing. The output is operationally coupled to the processor. The output is operationally coupled to the external electronic device. The audio signal is directed to the external electronic device between the minimum and maximum volume.

There has thus been outlined, rather broadly, the more important features of the disclosure in order that the detailed description thereof that follows may be better understood, and in order that the present contribution to the art may be better appreciated. There are additional features of the disclosure that will be described hereinafter and which will form the subject matter of the claims appended hereto.

The objects of the disclosure, along with the various features of novelty which characterize the disclosure, are pointed out with particularity in the claims annexed to and forming a part of this disclosure.

BRIEF DESCRIPTION OF THE DRAWINGS

The disclosure will be better understood and objects other than those set forth above will become apparent when consideration is given to the following detailed description thereof. Such description makes reference to the annexed drawings wherein.

DESCRIPTION OF THE PREFERRED EMBODIMENT

Figure 1:
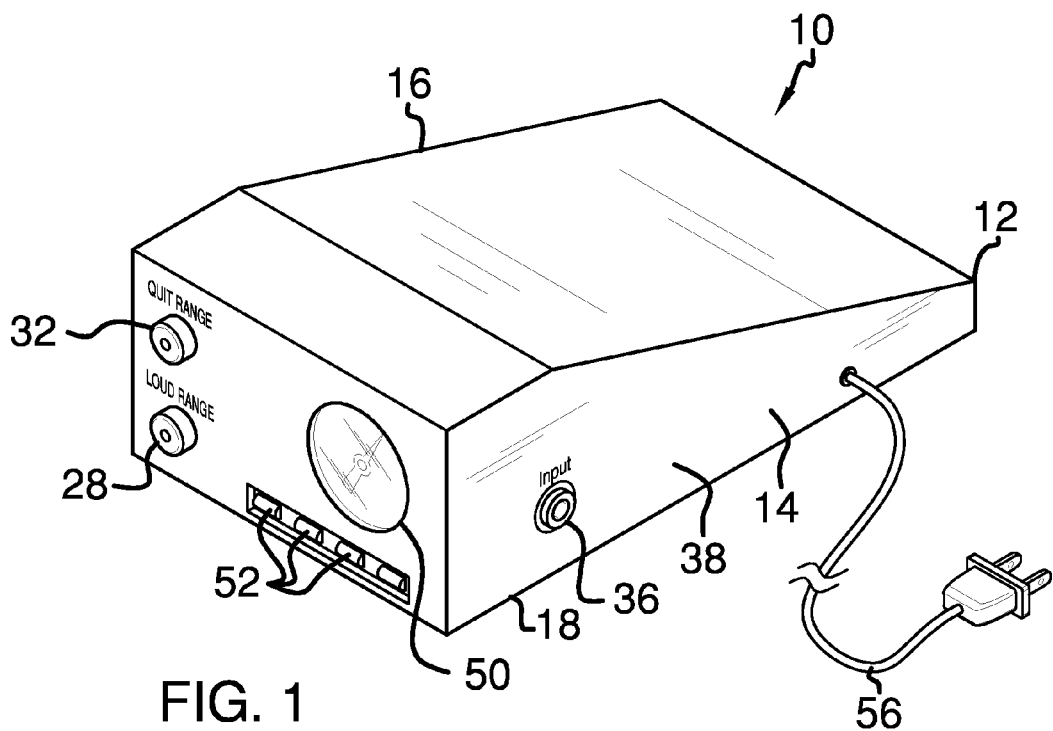
FIG. 1 is a perspective view of a volume control assembly according to an embodiment of the disclosure.
Figure 2:
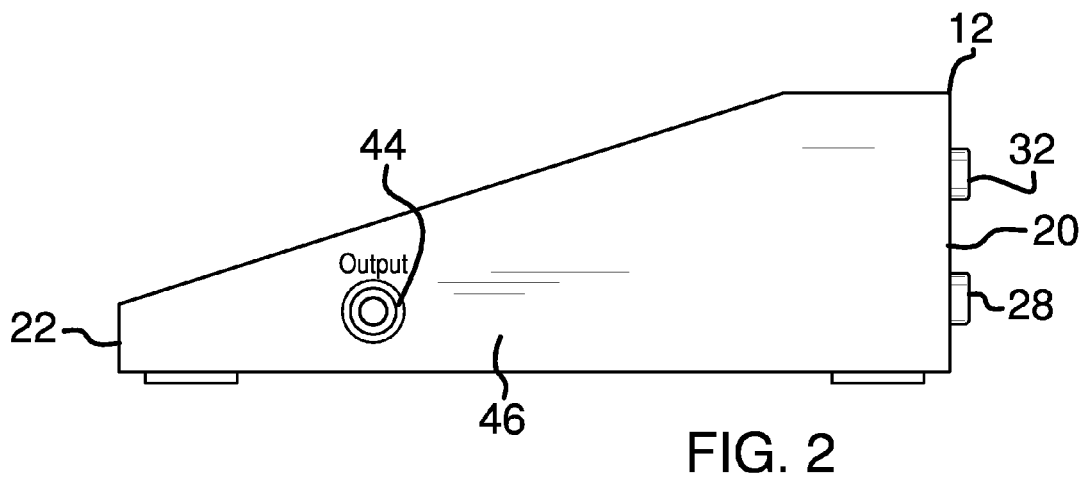
FIG. 2 is a right side view of an embodiment of the disclosure.
Figure 3:
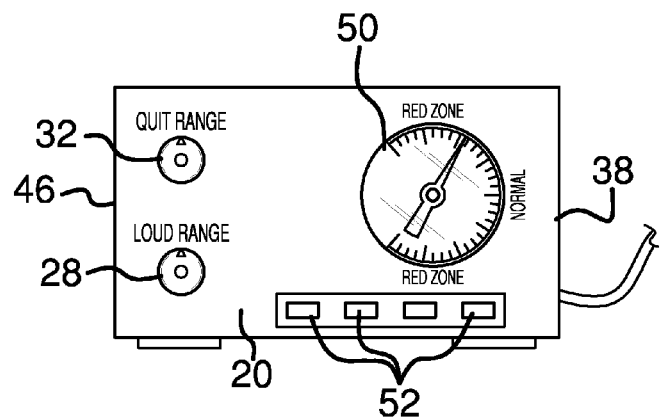
FIG. 3 is a front view of an embodiment of the disclosure.
Figure 4:
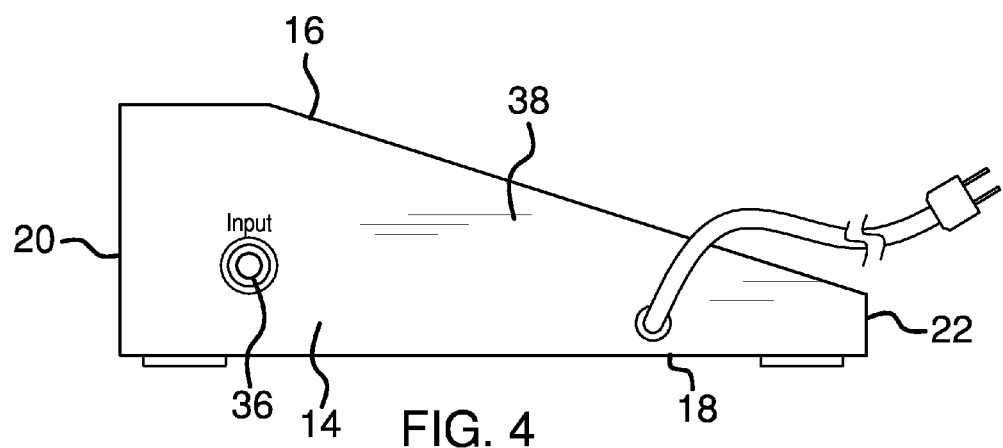
FIG. 4 is a left side view of an embodiment of the disclosure.
Figure 5:
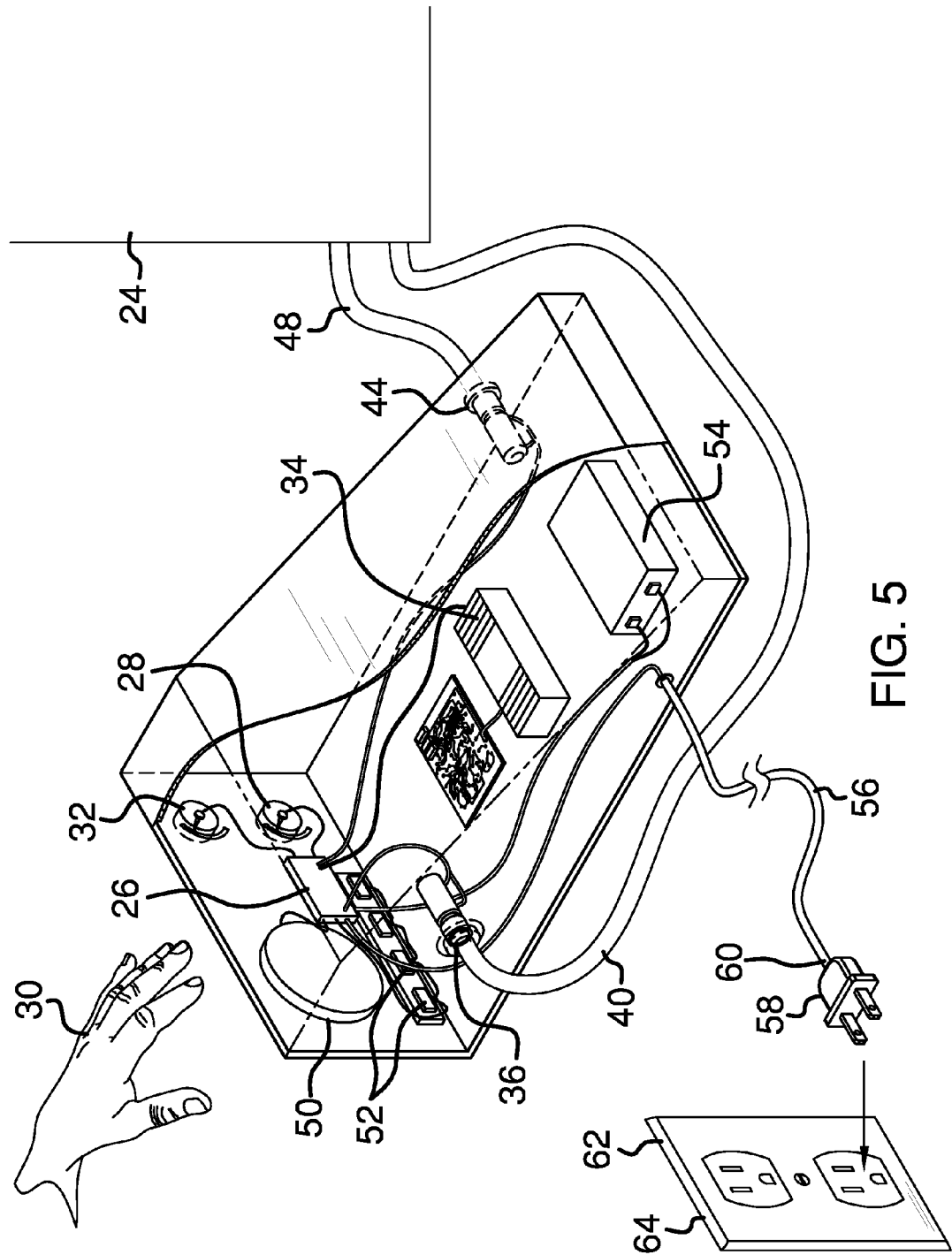
FIG. 5 is a cut-away perspective view of an embodiment of the disclosure.
Figure 6:
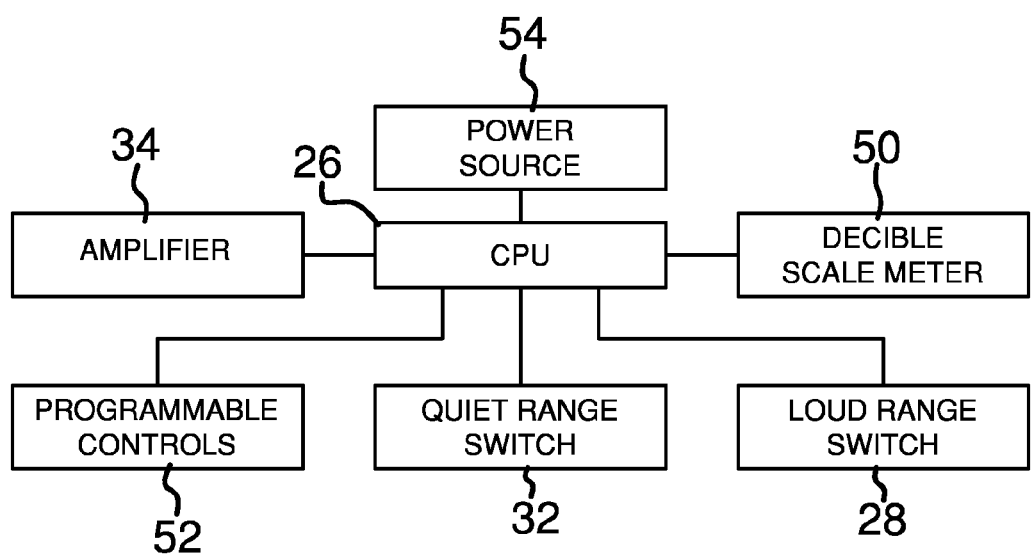
FIG. 6 is a schematic view of an embodiment of the disclosure.

With reference now to the drawings, and in particular to FIGS. 1 through 6 thereof, a new control device embodying the principles and concepts of an embodiment of the disclosure and generally designated by the reference numeral 10 will be described.

As best illustrated in FIGS. 1 through 6, the volume control assembly 10 generally comprises a housing 12. The housing 12 has an outer wall 14 extending between each of a top wall 16 and a bottom wall 18 of the housing 12. The top wall 16 of the housing 12 slopes downwardly between a front side 20 and a back side 22 of the outer wall 14 of the housing 12. The housing 12 may be positioned proximate an external electronic device 24. The external electronic device 24 may be a television of any conventional design. A processor 26 is coupled to the housing 12. The processor 26 may be an electronic audio signal processor of any conventional design.

A loud actuator 28 is coupled to the front side 20 of the outer wall 14 of the housing 12. The loud actuator 28 is electrically coupled to the processor 26. The loud actuator 28 defines a maximum volume of an audio signal from the external electronic device 24. Moreover, the loud actuator 28 is actuatable by a user 30. The loud actuator 28 is positionable between a minimum and a maximum threshold for the maximum volume of the audio signal.

A quiet actuator 32 is coupled to the front side 20 of the outer wall 14 of the housing 12. The quiet actuator 32 is electrically coupled to the processor 26. The quiet actuator 32 defines a minimum volume of the audio signal from the external electronic device 24. Additionally, the quiet actuator 32 is actuatable by the user 30. The quiet actuator 32 is positionable between a minimum and a maximum threshold for the minimum volume of the audio signal.

An amplifier 34 is coupled to the housing 12. The amplifier 34 is electrically coupled to the processor 26. The amplifier 34 amplifies the audio signal above the minimum volume defined by the quiet actuator 32 and reduces the audio signal below the maximum volume defined by the loud actuator 28. Finally, the amplifier 34 may be an electronic audio signal amplifier of any conventional design.

An input 36 is coupled to a first lateral side 38 of the outer wall 14 of the housing 12. The input 36 is electrically coupled to the processor 26. The input 36 is electrically coupled to an input cord 40. The input cord 40 may be an audio cord of any conventional design.

The input cord 40 is electrically coupled to the external electronic device 24. The input 36 is in electrical communication with the external electronic device 24.

Additionally, the input 36 receives the audio signal from the external electronic device 24.

An output 44 is coupled to a second lateral side 46 of the outer wall 14 of the housing 12. The output 44 is electrically coupled to the processor 26. The output 44 is electrically coupled to an output cord 48. The output cord 48 may be an audio cord of any conventional design. Moreover, the output cord 48 is electrically coupled to the external electronic device 24. The output 44 is in electrical communication with the external electronic device 24. The output 44 directs the audio signal to the external electronic device 24 between the minimum and maximum volume.

A meter 50 is coupled to the front side 20 of the outer wall 14 of the housing 12. The meter 50 is electrically coupled to the processor 26. The meter 50 indicates the volume of the audio signal. Additionally, the meter 50 may be an analog audio level meter of any conventional design.

A plurality of memory controls 52 is coupled to the front side 20 of the outer wall 14 of the housing 12. The plurality of memory controls 52 is electrically coupled to the processor 26. Each of the plurality of memory controls 52 actuates the processor 26 in a pre-determined set of performance parameters. A selected one of the plurality of memory controls 52 is actuatable by the user 30.

A power supply 54 is coupled to the housing 12. The power supply 54 is electrically coupled to the processor 26. The power supply 54 comprises a power cord 56 extending away from the first lateral side 38 of the outer wall 14 of housing 12. A plug 58 is electrically coupled to a free end 60 of the power cord 56. The plug 58 is electrically coupled to a power source 62. The power source 62 may be an electrical outlet 64 of any conventional design.

In use, the loud actuator 28 is positioned to determine the maximum volume the user 30 wishes to hear. The quiet actuator 32 is positioned to determine the minimum volume the user 30 wishes to hear. The assembly 10 adjusts the volume of the audio between differing programs on the external electronic device 24 to a more constant level. Additionally, the assembly 10 prevents the user 30 from having to manually adjust the volume level of the external electronic device 24.

With respect to the above description then, it is to be realized that the optimum dimensional relationships for the parts of an embodiment enabled by the disclosure, to include variations in size, materials, shape, form, function and manner of operation, assembly and use, are deemed readily apparent and obvious to one skilled in the art, and all equivalent relationships to those illustrated in the drawings and described in the specification are intended to be encompassed by an embodiment of the disclosure.

Therefore, the foregoing is considered as illustrative only of the principles of the disclosure. Further, since numerous modifications and changes will readily occur to those skilled in the art, it is not desired to limit the disclosure to the exact construction and operation shown and described, and accordingly, all suitable modifications and equivalents may be resorted to, falling within the scope of the disclosure. In this patent document, the word "comprising" is used in its non-limiting sense to mean that items following the word are included, but items not specifically mentioned are not excluded.

A reference to an element by the indefinite article "a" does not exclude the possibility that more than one of the element is present, unless the context clearly requires that there be only one of the elements.

I claim:

1. A volume control assembly configured to be coupled to an external electronic device such that said assembly automatically adjusts an audible volume of the external electronic device between a minimum and a maximum volume, said assembly comprising:
   a housing configured to be positioned proximate the external electronic device;
   a processor coupled to said housing;
   a loud actuator coupled to said housing, said loud actuator being operationally coupled to said processor such that said loud actuator defines a maximum volume of an audio signal from the external electronic device;
   a quiet actuator coupled to said housing, said quiet actuator being operationally coupled to said processor such that said quiet actuator defines a minimum volume of the audio signal from the external electronic device;
   an amplifier coupled to said housing, said amplifier being operationally coupled to said processor such that said amplifier amplifies the audio signal above the minimum volume defined by said quiet actuator and reduces the audio signal below the maximum volume defined by said loud actuator;
   an input coupled to said housing, said input being operationally coupled to said processor, said input being operationally coupled to the external electronic device such that said input receives the audio signal from the external electronic device; and
   an output coupled to said housing, said output being operationally coupled to said processor, said output being operationally coupled to the external electronic device such that the audio signal is directed to the external electronic device between the minimum and maximum volume.

2. The assembly according to claim 1, further comprising said loud actuator being electrically coupled to said processor, said loud actuator being actuatable by a user such that said loud actuator is positionable between a minimum and a maximum threshold for the maximum volume of the audio signal.

3. The assembly according to claim 1, further comprising said quiet actuator being electrically coupled to said processor, said quiet actuator being actuatable by a user such that said quiet actuator is positionable between a minimum and a maximum threshold for the minimum volume of the audio signal.

4. The assembly according to claim 1, further comprising said amplifier being electrically coupled to said processor.

5. The assembly according to claim 1, further comprising said input being electrically coupled to said processor, said input being electrically coupled to a cord being electrically coupled to the external electronic device such that said input is in electrical communication with the external electronic device.

6. The assembly according to claim 1, further comprising said output being electrically coupled to said processor, said output being electrically coupled to a cord being electrically coupled to the external electronic device such that said output is in electrical communication with the external electronic device.

7. The assembly according to claim 1, further comprising a meter coupled to said housing.

8. The assembly according to claim 7, further comprising said meter being electrically coupled to said processor.

9. The assembly according to claim 8, further comprising said meter indicating a volume of the audio signal.

10. The assembly according to claim 1, further comprising a power supply coupled to said housing.

11. The assembly according to claim 10, further comprising said power supply being electrically coupled to said processor.

12. The assembly according to claim 11, further comprising said power supply comprising a power cord extending away from said housing.

13. The assembly according to claim 12, further comprising said power cord being electrically coupled to a power source.

14. A volume control assembly configured to be coupled to an external electronic device such that said assembly automatically adjusts an audible volume of the external electronic device between a minimum and a maximum volume, said assembly comprising:
   a housing configured to be positioned proximate the external electronic device;
   a processor coupled to said housing;
   a loud actuator coupled to said housing, said loud actuator being electrically coupled to said processor such that said loud actuator defines a maximum volume of an audio signal from the external electronic device, said loud actuator being actuatable by a user such that said loud actuator is positionable between a minimum and a maximum threshold for the maximum volume of the audio signal;

a quiet actuator coupled to said housing, said quiet actuator being electrically coupled to said processor such that said quiet actuator defines a minimum volume of the audio signal from the external electronic device, said quiet actuator being actuatable by a user such that said quiet actuator is positionable between a minimum and a maximum threshold for the minimum volume of the audio signal from the;

an amplifier coupled to said housing, said amplifier being electrically coupled to said processor such that said amplifier amplifies the audio signal above the minimum volume defined by said quiet actuator and reduces the audio signal below the maximum volume defined by said loud actuator;

an input coupled to said housing, said input being electrically coupled to said processor, said input being electrically coupled to a cord being electrically coupled to an external electronic device such that said input is in electrical communication with the external electronic device, said input receiving the audio signal from the external electronic device;

an output coupled to said housing, said output being electrically coupled to said processor, said output being electrically coupled to a cord being electrically coupled to the external electronic device such that said output is in electrical communication with the external electronic device, said output directing the audio signal to the external electronic device between the minimum and maximum volume;

a meter coupled to said housing, said meter being electrically coupled to said processor, said meter indicating the volume of the audio signal; and a power supply coupled to said housing, said power supply being electrically coupled to said processor, said power supply comprising a power cord extending away from said housing, said power cord being electrically coupled to a power source.

\* \* \* \* \*